(12) United States Patent  
Chopra (10) Patent No.: US 8,988,956 B2  
(45) Date of Patent: Mar. 24, 2015

(54) PROGRAMMABLE MEMORY BUILT IN SELF REPAIR CIRCUIT

(71) Applicant: MoSys, Inc., Santa Clara, CA (US)

(72) Inventor: Rajesh Chopra, San Ramon, CA (US)

(73) Assignee: MoSys, Inc., Santa Clara, CA (US)

( * ) Notice: Subject to any disclaimer, the term of this patent is extended or adjusted under 35 U.S.C. 154(b) by 0 days.

(21) Appl. No.: 13/834,856

(22) Filed: Mar. 15, 2013

(65) Prior Publication Data

US 2014/0078841 A1 Mar. 20, 2014

Related U.S. Application Data

(60) Provisional application No. 61/702,732, filed on Sep. 18, 2012.

(51) Int. Cl.
G11C 29/00 (2006.01)
G11C 29/04 (2006.01)
G11C 29/44 (2006.01)

(52) U.S. Cl.
CPC ............ *G11C 29/04* (2013.01); *G11C 29/4401* (2013.01); *G11C 2029/4402* (2013.01)
USPC .......................................... 365/200; 365/201

(58) Field of Classification Search
CPC ............................... G11C 29/50; G11C 29/785
USPC .................................................. 365/200, 201
See application file for complete search history.

(56) References Cited

U.S. PATENT DOCUMENTS

| | | | |
|---|---|---|---|
| 3,962,687 A | 6/1976 | Suzumura et al. | |
| 6,920,544 B2 | 7/2005 | Watanabe | |
| 7,168,005 B2 | 1/2007 | Adams et al. | |
| 7,181,659 B2 | 2/2007 | Bravo et al. | |
| 7,360,134 B1 | 4/2008 | Jacobson et al. | |
| 7,631,236 B2 | 12/2009 | Gorman et al. | |
| 7,814,385 B2 | 10/2010 | Bahl | |
| 7,836,352 B2 | 11/2010 | Sharma et al. | |
| 7,917,825 B2 | 3/2011 | Lee | |
| 7,979,758 B2 | 7/2011 | Hur et al. | |
| 8,230,433 B2 | 7/2012 | Chiu et al. | |
| 8,245,105 B2 | 8/2012 | Dell et al. | |
| 8,370,725 B2 | 2/2013 | Miller et al. | |
| 8,572,357 B2 | 10/2013 | Greiner et al. | |
| 2002/0002573 A1 | 1/2002 | Landers et al. | |
| 2006/0179369 A1 | 8/2006 | Bravo et al. | |
| 2006/0239090 A1* | 10/2006 | Anazawa et al. | 365/200 |
| 2008/0005706 A1 | 1/2008 | Sharma et al. | |
| 2008/0059850 A1 | 3/2008 | Bahl | |
| 2008/0122026 A1* | 5/2008 | Chen et al. | 257/529 |
| 2008/0148007 A1 | 6/2008 | Lee | |

(Continued)

OTHER PUBLICATIONS

"Search Report from related Singapore Application No. 201101222-6 Dated Dec. 2, 2011, 13 Pages".

*Primary Examiner* — Michael Tran (74) *Attorney, Agent, or Firm* — Wagner Blecher LLP (57) ABSTRACT

An integrated circuit chip comprising at least one programmable built-in self-repair (PBISR) for repairing memory is described. The PBISR comprises an interface that receives signals external to the integrated chip. The PBISR further includes a port slave module that programs MBISR registers, program and instruction memory. The PBISR further comprises a programmable transaction engine and a programmable checker. Further, the MBISR comprises an eFUSE cache that implements logic to denote defective elements.

32 Claims, 7 Drawing Sheets

(56) References Cited

U.S. PATENT DOCUMENTS

| | | |
|---|---|---|
| 2008/0178053 A1 | 7/2008 | Gorman et al. |
| 2009/0007134 A1 | 1/2009 | Chiu et al. |
| 2009/0144595 A1 | 6/2009 | Reohr, Jr. et al. |
| 2009/0219775 A1 | 9/2009 | Hur et al. |
| 2010/0195425 A1* | 8/2010 | Urakawa et al. ............. 365/200 |
| 2010/0241830 A1 | 9/2010 | Owens et al. |
| 2011/0078421 A1 | 3/2011 | Greiner et al. |
| 2011/0191647 A1 | 8/2011 | Miller et al. |

* cited by examiner

PROGRAMMABLE MEMORY BUILT IN SELF REPAIR CIRCUIT

CROSS-REFERENCE TO RELATED U.S. APPLICATIONS

This application claims priority to and benefit of co-pending U.S. Patent Application No. 61/702,732, filed on Sep. 18, 2012, entitled, "PROGRAMMABLE MEMORY BUILT IN SELF REPAIR CIRCUIT," by Rajesh Chopra, and assigned to the assignee of the present application.

BACKGROUND

Testing memories in a chip has become increasingly critical as memories have increased in complexity and density. The shrinking of geometries has even grater effect upon memories due to their tight layout hence creating new failure modes. These failure modes can be detected by a high speed tester. High speed testers are expensive and they need dedicated access to the memories.

DISCLOSURE OF THE INVENTION

An integrated circuit chip comprising at least one memory built-in self-repair (MBISR) is described. The MBISR comprises an interface that receives signals external to the integrated chip. The MBISR further includes a port slave module that programs MBISR registers, program and instruction memory. The MBISR further comprises a programmable transaction engine and a programmable checker. Further, the MBISR comprises an eFUSE cache that implements logic to denote defective elements.

BRIEF DESCRIPTION OF THE DRAWINGS

The accompanying drawings, which are incorporated in and form a part of this application, illustrate embodiments of the present invention, and together with the description, serve to explain the principles of the invention. Unless noted, the drawings referred to in this description should be understood as not being drawn to scale.

DESCRIPTION OF EMBODIMENTS

Reference will now be made in detail to various embodiments, examples of which are illustrated in the accompanying drawings. While the subject matter will be described in conjunction with these embodiments, it will be understood that they are not intended to limit the subject matter to these embodiments. Furthermore, in the following description, numerous specific details are set forth in order to provide a thorough understanding of the subject matter. In other instances, conventional methods, procedures, objects, and circuits have not been described in detail as not to unnecessarily obscure aspects of the subject matter.

Notation and Nomenclature

Unless specifically stated otherwise as apparent from the following discussions, it is appreciated that throughout the present Description of Embodiments, discussions utilizing terms such as "generating," "searching," "fixing," or the like, refer to the actions and processes of a computer system or similar electronic computing device (or portion thereof) such as, but not limited to: an electronic control module, FPGA, ASIC, and/or a management system (or portion thereof). The electronic computing device manipulates and transforms data represented as physical (electronic) quantities within the electronic computing device's processors, registers, and/or memories into other data similarly represented as physical quantities within the electronic computing device's memories, registers and/or other such information storage, processing, transmission, or/or display components of the electronic computing device or other electronic computing device(s).

Overview of Discussion

Memory programmable built-in self-test (PBIST) modules are increasingly popular as memories become denser and more complex. PBIST modules allow users to choose from a group of pre-made test patterns (e.g., algorithms), and performs built-in tests based at least in part upon a selected pattern to test memory blocks for defects.

PBIST is embedded inside the chip hence it does not need a dedicated interface to memory and the test patterns can be programmed to identify various failure modes. PBIST can also identify the bad rows, columns and sense amps and can generate the repair solution inside the chip. This repair solution can be then programmed on chip using eFuses.

Embodiments described herein discuss a memory built-in self-repair (MBISR) module that comprises at least one PBIST, and allows a user to not only select a test pattern, but also to create their own test patterns/test algorithms.

Example techniques, devices, systems, and methods for a memory built-in self-repair module (BISR) module that allows a user to create their own test patterns are described herein. Discussion begins with a high level description of an integrated circuit comprising memory partitions and at least one memory BISR. Example memory programmable built-in self-test modules and their components are then described. Lastly, an example method of use is described.

Memory Partitions and Memory Self Repair Module

Figure 1:
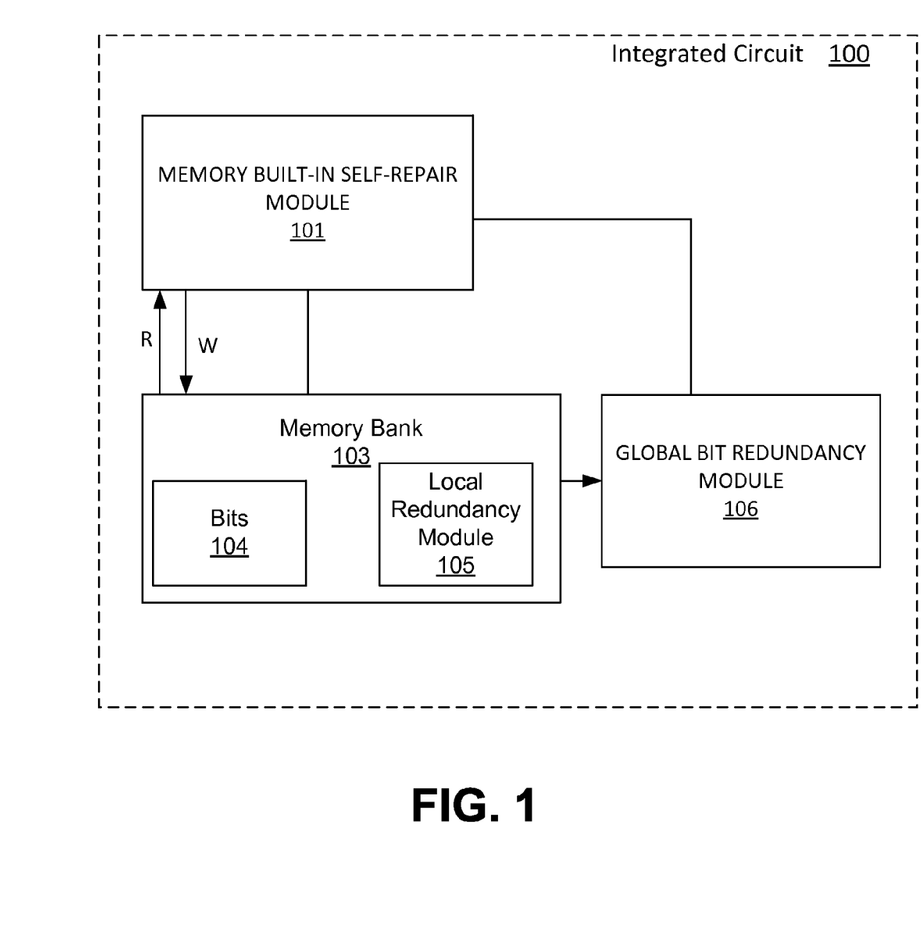
FIG. 1 is a block diagram of an example integrated circuit, in accordance with one embodiment.

FIG. 1 shows an example integrated circuit 100 which includes a memory bank 103 coupled to a BISR 101. BISR module 101 may also be referred to as BISR 101 or a memory BISR (MBISR), herein. Circuit 100 is well-suited to partitioning memory into a plurality of partitions, and subsequent groupings therein. Data or a data bar may be written to a memory partition by integrated circuit 100. Integrated circuit 100 comprises a memory bank 103 that comprises memory bits 104 and a local redundancy module 105 to replace defective instances of memory bits 104. For the sake of brevity, local redundancy module 105 will not be discussed in depth herein. In addition to local redundancy module 105, integrated circuit 100 may comprise global bit redundancy module 106 to debug bits when a local redundancy module 105 cannot provide extra empty memory.

In an embodiment, a BISR 101 is operable to run test patterns on memory blocks. In some embodiments various patterns, or algorithms, may be ran on a partition to test memory. In some embodiments, BISR 101 allows a user to select a pattern to test a memory partition. Additionally, BISR 101 allows a user to create (e.g., program) a pattern to test a memory partition.

Figure 2:
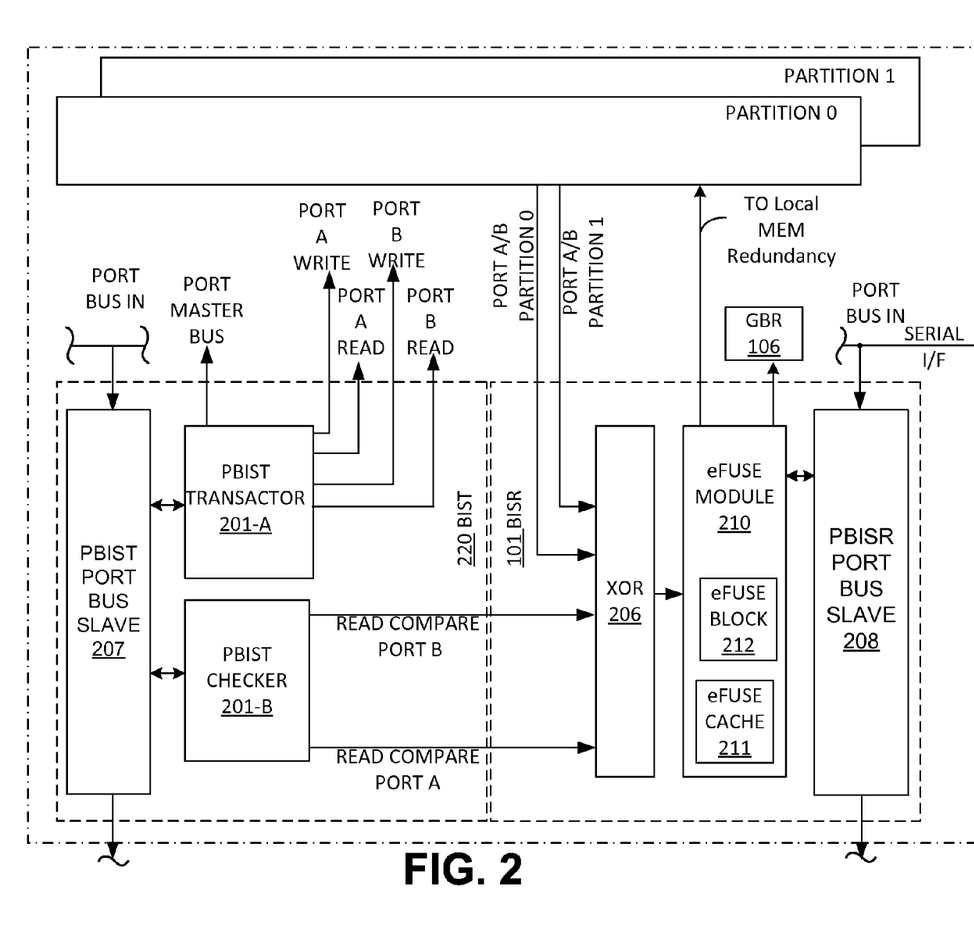
FIG. 2 is a block diagram of an example memory built-in self-test module in accordance with one embodiment.

FIG. 2 shows an expanded example BISR module 101 coupled to a BIST module 220. In the present embodiment, both the BIST 220 and the BISR 101 are programmable, and can be referred to as a Programmable Built In Self Test (PBIST) 220 and Programmable Built In Self Repair (PBISR) 101. In another embodiment, the BIST 220 can be non-programmable, having instead a fixed test mode that interacts with the PBISR 220. The programmability of these modules arises from use of a PBIST port bus slave 207 and PBISR port bus slave 208, respectively.

PBIST 220 includes transactor 201-A, a checker 201-B, a glue logic module comprising various logic circuitry (e.g., XOR 206, XNOR, NOR, AND, OR, NOT, etc.), and an eFUSE Module 210 comprising an eFUSE cache 211 for temporary storage of the repair data, and eFuses block 212 for permanent fixes by programming of fuses. Herein, an MBISR module 101 may also be referred to as an MBISR instance 101, an MBISR 101. Moreover, MBISR 101 may also be referred to as a programmable BISR (PBISR).

Port bus is coupled to a serial interface for external communication and interoperability between chips, using standards such as SMBus, I2C, SPI, e.g., for programming test patterns, repair algorithms, redundant memory resource allocation, repair thresholds, etc. By utilizing PBIST slave 207 and PBISR slave 208, PBIST 220 and PBISR 101 can interact with external resources, e.g., via serial I/F, in the background while the PBIST 220 and PBISR 101 are concurrently operating with the core memory, partition 0 and 1. PBIST 220 interacts with PBIST transactor 201-A selectively, to portions of memory therein that are not in use. Likewise, PBISR 101 interacts with eFUSE module 210 selectively, and to portions of memory therein that are not in use. This allows at-speed, back-to-back transactions to occur, thereby reducing test time, down time, updates, readouts, reprogramming, and the like.

More detail on the shared memory redundancy is provided in commonly owned U.S. Patent Application Ser. No. 61/702, 253, to Dipak Sikdar, and entitled: "SHARED MEMORY REDUNDANCY," which is hereby incorporated by reference in its entirety.

In an embodiment, an MBISR instance 101 instantiates a PBIST transactor 201-A and a PBIST checker 201-B. Each of transactor 201-A and checker 201 B is an instance of memory programmable built-in self-test (MBIST) (e.g., 300 of FIG. 3). Transactor 201-A and/or checker 201-B are programmable in some embodiments. Transactor 201-A and/or checker 201-B have at least one write port and one read port. For example, FIG. 2 shows a transactor 201-A comprising two read ports and two write ports (e.g., port A write, port A read, port b write, and port b read).

In various embodiments, an MBISR 101 may run synchronously or asynchronously with another MBISR instance on IC 100. For example, MBISR 101 may perform a built-in self-test (BIST or MBIST) on partitions 0 and 1 (shown in FIG. 2) while another MBISR performs a BIST on partitions 2 and 3 (not shown), in a parallel construction to that shown. Cross coupling multiple MBISRs can allow them to share tasks, run synchronously or asynchronously on memory on IC 101.

Each MBISR instance 101 is operable to instantiate a port bus slave 207 and/or 208 to write to, or program, various components within an MBISR 101. For example, port bus slave 207 is operable to program: an instruction flip flop array (e.g., programmable instruction memory 301 of FIG. 3), a configuration flip flop array (e.g., programmable configuration memory 302 of FIG. 3), MBISR registers (e.g., specialized counters, etc.), eFUSE cache 211 contents, and/or eFUSE registers, etc.

In an embodiment MBISR 101 is operable to perform MBIST on partitions, eFUSE SRAMs, BCR SRAMs, uCTRL SRAMs, and/or Tracebuffer SRAMs, etc. Using a counter, MBISR 101 can implement logic to STALL BIST on refresh using a counter, in one embodiment. In various embodiments, MBISR 101 is operable to: store a complete address and/or failing data in BCR SRAM, implement operation count windowing, implement START/STOP address windowing, program a plurality of configuration registers for a plurality of registers using a port slave bus 207. In an embodiment, a 32-bit Fail Word Counter is associated with each partition and each Read port.

As discussed above, MBISR 101 is operable to receive data from memory partitions. Port A read data is compared with expected data at checker 201-B, in an embodiment, to create read compare data from port A. Compare data may comprise failing words. Fail Word counters are updated when a mismatch is found and failing words are forwarded to eFUSE cache 211. Similarly, in an embodiment, Port B data is compared with expected data at checker 201-B to create read compare data from Port B.

In various embodiments, an eFUSE module 210 is operable to: implement one port bus transaction to clear eFUSE cache 211, implement logic to denote defective redundant memory elements, and/or accumulate failing bits with "OR" logic, etc.

In one embodiment MBISR 101 supports failure analysis modes. Various failure analysis modes are operable to store Sampler data, store raw data from partitions, and/or store XOR data.

Figure 3:
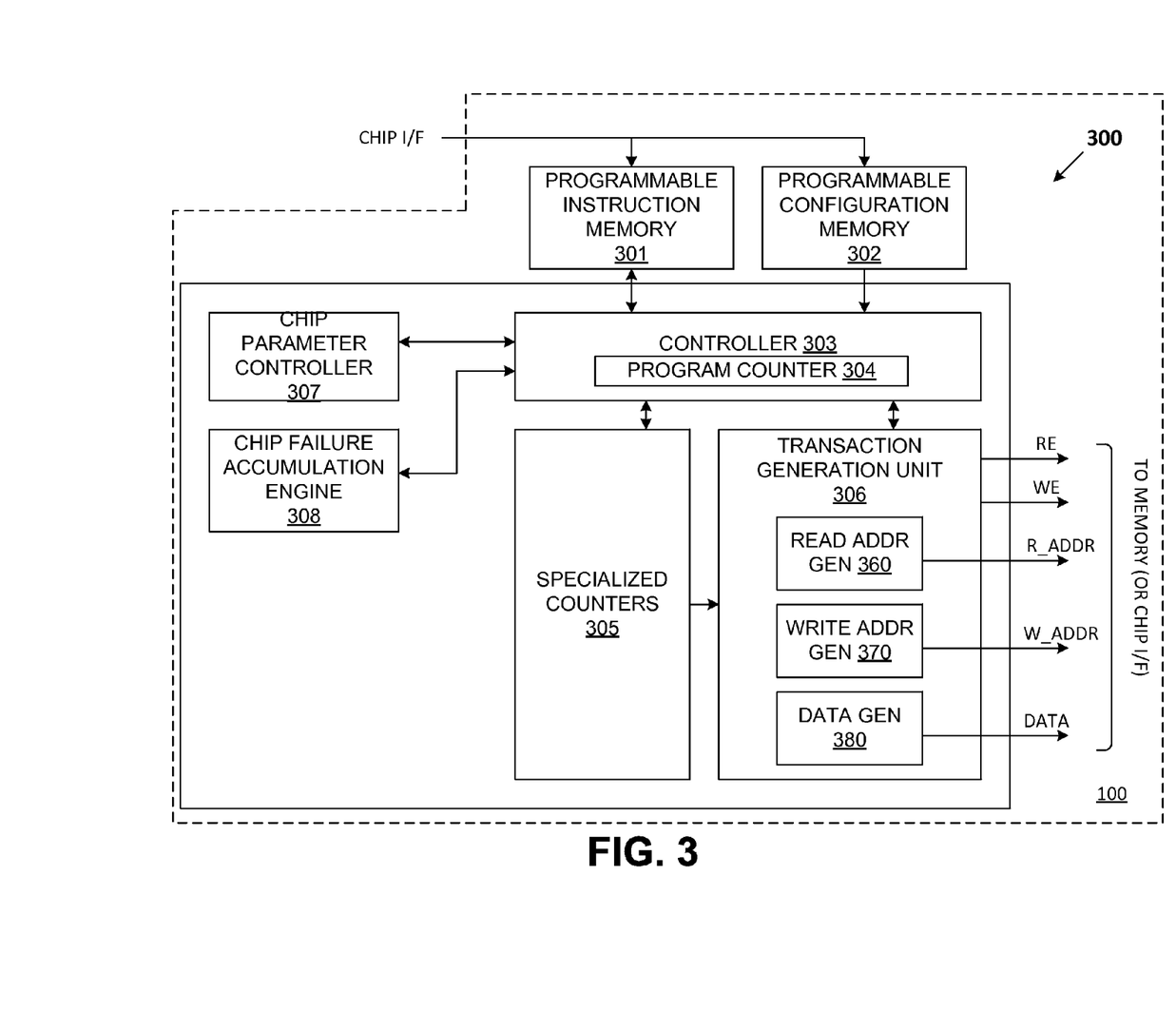
FIG. 3 is an expanded block diagram of an example built-in self-test module in accordance with one embodiment.

MBISR 101 is further operable to implement in-field repair (IFR). In some embodiments, a BIST 300 is started on reset deassertion or through a port bus transaction. In some embodiments, hard redundancy is soft programmed in partitions.

Figure 5:
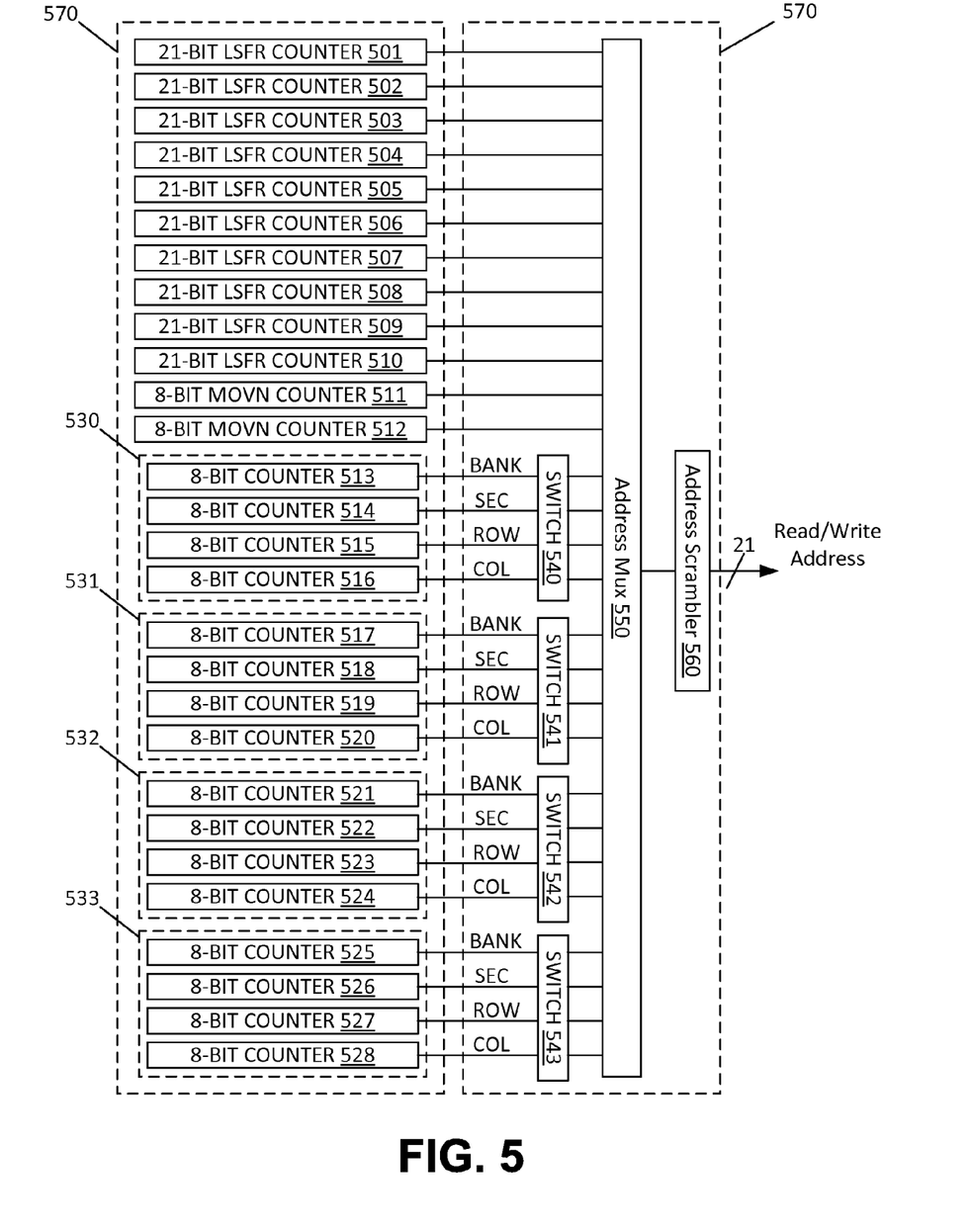
FIG. 5 is a block diagram illustrating an op-code implemented by a PBIST, in accordance with one embodiment.

MBISR 101 may comprise other features. For example, in one embodiment at least one counter is row fast (i.e., big counters 501-512 may be a combination of row fast and column fast counters, as shown in FIG. 5). In one embodiment, MBISR 101 is operable to perform bit surround disturb algorithm. As another example MBISR 101 may be operable to invert data by sector, bank, and/or partition. In one embodiment, a BIST 300 can read a partition interface directly. In other words, a BIST 300 may read memory functionality while bypassing surrounding logic. In some embodiments BIST 300 may stop on a particular cycle or access to read interface information. Additionally, in an embodiment, MBISR 101 may run transactions at a speed with greater depth than a current TraceBuffer. In an embodiment, MBISR 101 may bypass SerDes and test memory at a greater speed than the TraceBuffer.

Memory Programmable Built-In Self-Test Module

In various embodiments BIST 300 (or memory programmable built-in self-test (PBIST) 300) is operable to generate Read/Write/NOP access stimuli to perform Standard BIST, Test, and/or Characterization programs.

FIG. 3 shows an expanded example PBIST 300 comprising: a programmable instruction memory 301, a programmable configuration memory 302, a controller 303, a program counter 304, specialized counters 305, a transaction generation unit 306, chip parameter controller 307, and chip failure accumulation engine 308. Transaction generation unit 306 comprises read address generator 360, write address generator 370, and data generator 380.

In an embodiment, PBIST 300 is operable to: run 64 instructions, initiate port bus transactions as a port bus master, perform HALT and RESUME operations, reset big counters 501-512 using port bus transactions such that big counters 501-512 may be re-used, perform an address uniqueness test, etc.

More detail on a programmable test engine is provided in commonly owned U.S. patent application Ser. No. 13/030,358, to Rajesh Chopra, entitled "PROGRAMMABLE TEST ENGINE (PCDTE) FOR EMERGING MEMORY TECHNOLOGIES" which is hereby incorporated by reference in its entirety.

Figure 4:
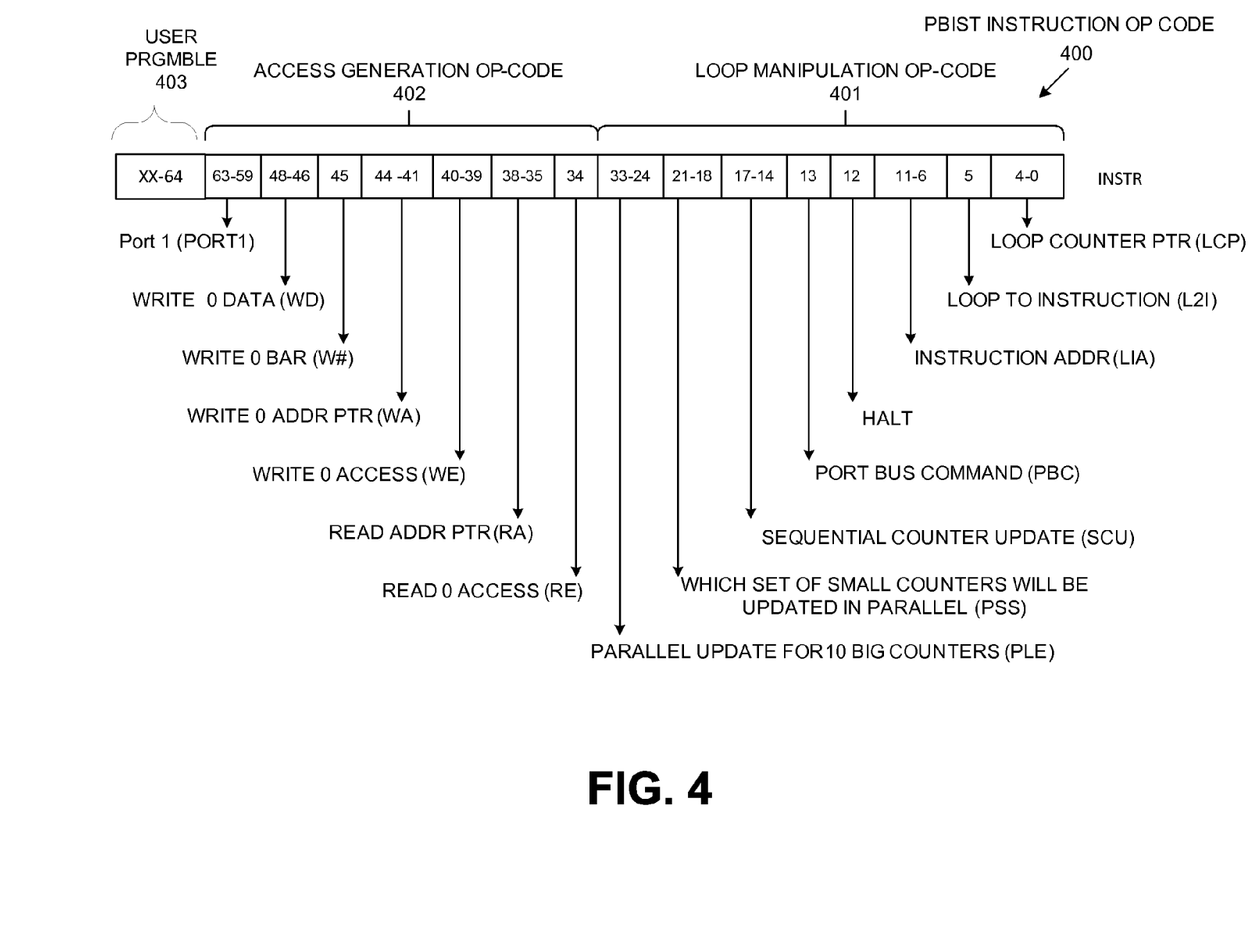
FIG. 4 is a block diagram of an example block diagram illustrating counters used in a PBIST, in accordance with one embodiment.

FIG. 4 shows an example instruction op-code 400 for PBIST 300. In one example, a PBIST instruction op-code 400 is 64 bits wide. The most significant (MSB) 30 bits constitute access generation op-code 402 and the least significant (LSB) 34 bits are for loop manipulation op-code 401. Instruction op-code 400 is used to initiate read/write operations or no operation (NOP) to a memory (or other circuitry). PBIST instruction op-code 400 is able to access different address sources from different ones of the specialized counters 305.

PBIST instruction op-code 400 is also able to access different sources of data from the data registers and the random data generator 380 within transaction generation unit 306. PBIST instruction op-code 400 has the ability to loop to itself, as well as the ability to loop with any other PBIST instruction op-code. PBIST instruction op-code 400 is able to increment multiple counters 305 in parallel.

PBIST instruction op-code 400 is also able to increment multiple counters 305 sequentially. Although instruction op-code 400 includes 64-bits in the illustrated example, it is understood that instruction op-codes having different widths can be implemented in other embodiments. Optional user-programmable bits from 64-xx, where xx is any desired and supported bit length, may be included in instruction op code 400 to provide additional, or more refined, instructions, e.g., test instructions for different granularity or operations in testing memory word lines, etc.

PBIST instruction op-code 400 is split into two op-codes, including a loop manipulation op-code 401 that controls program counter 304 and specialized counters 305, and an access generation op-code 402 that generates instruction dependent transactions. Access generation op-code 402 can also be used to change the key parameters of the integrated circuit 100, such as timing and voltage, using chip parameter controller 307.

Access generation op-code 402 includes a read access enable bit (RE=INST[49]), a read address pointer (RA=INST[53:50]), a write access enable bit (WE=INST[27]), a write address pointer (WA=INST[30-28]), a write data bar select signal (W#=INST[40:39]), a write data multiplexer select value (WD=INST[48:46]), and data from port 1 (PORT1=INST[63:59]). A read access enable bit RE having a logic '0' value indicates that no read operation should be performed (NOP), while a read access enable bit RE having a logic '1' value indicates a read operation will be performed. Controller 303 passes the read access enable bit RE through transaction generation unit 306 to the memory under test.

In one embodiment, access generation op-code 402, a write access enable bit WE having a logic '0' value indicates that no write operation should be performed (NOP), while a write access enable bit having a logic '1' value indicates that a write operation will be performed. Controller 303 passes the write access enable bit WE through transaction generation unit 306 to the memory under test.

The read and write address pointers indicate which one of the specialized counters 305 will provide an address for an indicated operation. Controller 303 transmits the address pointer to the address multiplexer 550 (of FIG. 5) in address generation block 570 (of FIG. 5). In response, address multiplexer 550 routes a selected one of the 21-bit counter values provided by big counters 501-512 and switches 540-543 to address scrambler 560. Address scrambler 560 scrambles the received counter value in the manner described above to provide an address to the memory under test.

Also within access generation op-code 402, the write data register select value WD indicates which one of a plurality of data registers within transaction generation unit 306 provides the write data for an indicated write operation. The write data bar select signal W# indicates whether the write data, or the inverse of the write data, is used to implement the write operation. Controller 303 transmits the write data register select value WD to the write data multiplexer 620 of data generator 600 (of FIG. 6). Multiplexer 620 routes a selected one of the 4-bit data values provided by data registers 601-608 in response to the write data register select value WD. Controller 303 also transmits the write data bar select signal W# to write data multiplexer 630 of data generator 600. Multiplexer 630 selectively routes either the data value routed by multiplexer 620, or the inverse of the data value routed by multiplexer 620, to data scrambler 650 in response to the write data bar select signal W#. Data scrambler 650 provides the data value DATA to the memory under test in the manner described above.

Loop manipulation op-code 401 includes a loop counter pointer (LCP=INST[4:0]), a loop to instruction indicator (L2I=INST[5]), a looped instruction address (LIA=INST[11:6]), a HALT signal (HALT=INST[12]), a port bus command (PBC=INST[13]), a sequential counter update (SCU=INST[17:14]), parallel small counter set select (PSS=INST[21:18]), and parallel update for 10 big counters (PLE=INST[33:24]).

The loop counter pointer LCP indicates which counter of the specialized counters 305 is used as a loop counter for the corresponding instruction. The loop counter pointer LCP is a 5-bit value, which allows any one of the big or small counters 501-512, any one of the counter sets 530-533, or any one of the small counters 513-516, 517-520, 521-524, or 525-528 to be selected as the loop counter of the instruction.

A loop-to-instruction indicator bit L2I having a logic '0' value indicates that the present instruction does not loop with any other instruction, while a loop to instruction indicator bit L2I having a logic '1' value indicates that the present instruction loops with another instruction op-code in programmable instruction memory 301. The looped instruction address LIA points to an address of programmable instruction memory 301 that stores an instruction that is looped with the present instruction. Allowing instructions to loop with one another advantageously increases the range of operations that can be implemented by MBISR 101.

FIG. 5 shows a plurality of counters. These counters are comprised within PBIST 300 (e.g., specialized counters 305). The counters 501-528 are programmed (configured) in response to configuration values stored in configuration registers within programmable configuration memory 302.

For example, PBIST 300 may comprise 21-bit big counters 501-512. By setting a bit in programmable configuration memory 302 big counters 510-512 can be configured as an a linear feedback shift register (LSFR) counter 501 (e.g., 501-510) or a moving inversion counter 511 (e.g., 511 and 512). Both LSFR counters 501 and moving inversion counters 511 may be used as a loop pointer or address and data generation. However, a moving inversion counter 511 may be incremented and not decremented, the reset value of a moving inversion counter 511 is a 6 bit value which is used to read the number of iterations, and the reset value for the moving inversion counter 511 is 6'b000000. Although particular special function counters are described herein, it is understood that other types of special function counters can be implemented in other embodiments.

Moreover, PBIST 300 may also comprise 21-bit small counter sets 530-533, wherein each set is made of four small counters (e.g., 513-516, 517-520, 521-524, and 525-528). Small counter sets 530-533 can be configured as column, row, sector, and bank counter. The small counter set 530 can be incremented/decremented (as a set) in parallel or in a sequential manner. In some embodiments only one 21-bit small counter set 530 can by updated in parallel through an instruction. Counter sets 530-533 can be used as a set or as individual counters as a loop pointer and can also be used for address and data generation.

Figure 6:
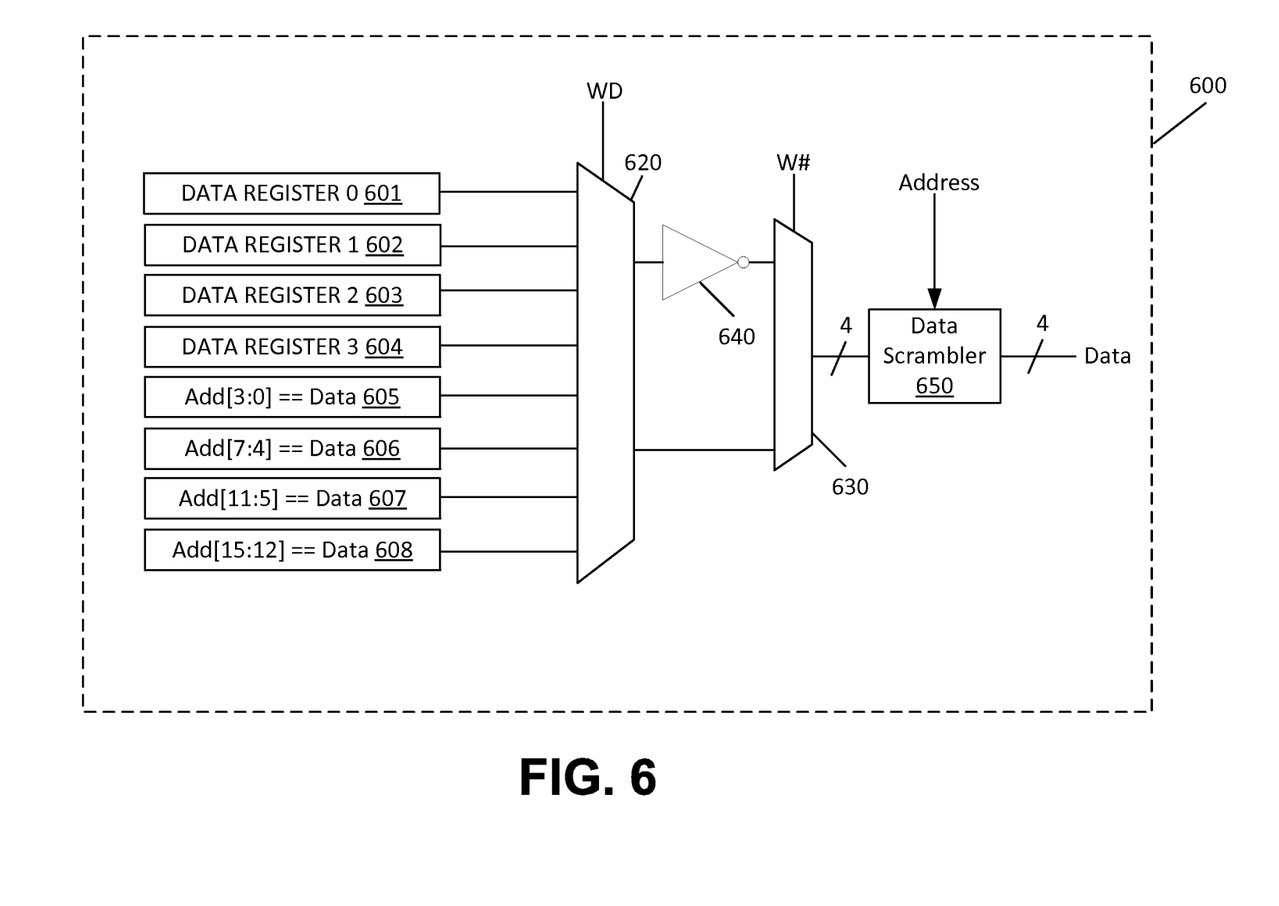
FIG. 6 is a block diagram illustrating a write data generation mux, in accordance with one embodiment.

FIG. 6 shows a block diagram illustrating a data generation circuit 600 of transaction generation unit 306 in accordance with various embodiments. Data generation circuit 600 includes data registers 601-604, address bits 605-608, write data multiplexers 620 and 630, inverter 640 and data scrambler 650. Data registers 601, 602, 603, and 604 are programmed to store the write data register bits DATA_REG[3:0], DATA_REG[7:4], DATA_REG[11:8] and DATA_REG[15:12], respectively.

Data registers 605, 606, 607, and 608 are programmed to store the address bits ADD[3:0], ADD[7:4], ADD[11:8], and ADD[15:12], respectively, from address generator 370. Thus, each of the data registers 601-608 can be programmed with a corresponding 4-bit data value, which can be used to generate data values to be written to the memory under test (or be provided as read compare data values).

Write data multiplexer 620 receives the 4-bit data values from data registers 601-604. Write data multiplexer 620 routes one of these 4-bit write data values in response to a write data selection signal WD. Inverter 645 inverts the write data value routed by multiplexer 620, such that write data multiplexer 630 receives both the write data value routed by multiplexer 620, and the inverse of the write data value routed by multiplexer 620. Write data multiplexer 420 routes either the write data value routed by multiplexer 620, or the inverse of the write data value routed by multiplexer 620, to data scrambler 650, in response to a write select signal W#. Data scrambler 650 scrambles the received data value, wherein the scrambling function is selected by the data scrambler value SCRAMBLER provided by a configuration register. The data scrambling function is selected in view of the data line twisting implemented by the memory under test, thereby ensuring that the memory under test receives the proper data values at the memory interface.

Note that the data scrambling function is programmable using a configuration register, thereby enabling MBISR 101 to be used to test different types of memories that have different data line twisting characteristics.

The 4-bit data value provided by data scrambler 650 (Data) is replicated a predetermined number of times to create the data value DATA. For example, if the data value DATA has a width of 72-bits (i.e., the width of a read/write operation to the memory under test is 72-bits), then the 4-bit data value provided by data scrambler 425 is repeated 18 times (72/4=18) to create the data value DATA.

MBISR 101 may comprise a Sampler. There are three major components in a Sampler: a clock/strobe generator, the flip flop (FF) to capture the signals to sample, and a memory to store the samples.

Example Methods of Operation

Figure 7A:
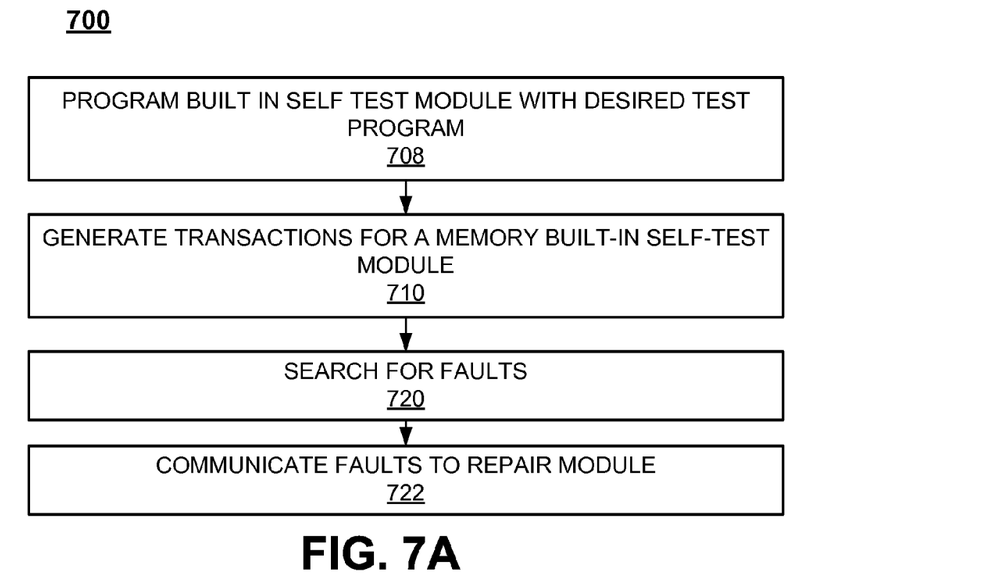
FIG. 7A is a flow diagram of a method of implementing a programmable built-in self test (BIST) engine for testing memory on a chip, in accordance with an embodiment.
Figure 7B:
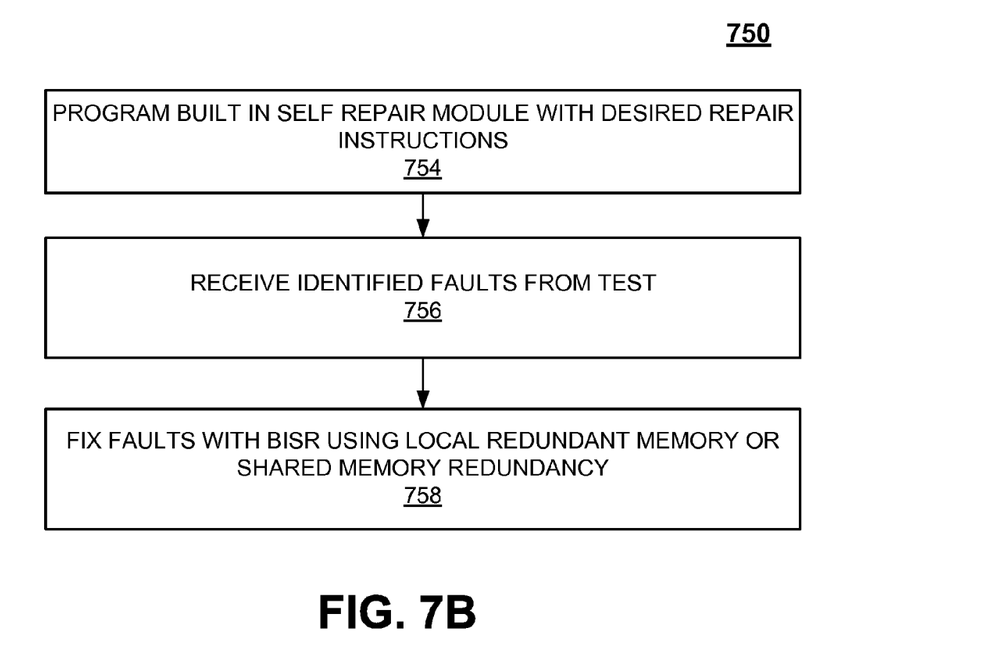
FIG. 7B is a flow diagram of a method of implementing a programmable built-in self repair (BISR) engine for testing memory on a chip, in accordance with an embodiment.

With reference to FIG. 7A-B, flow diagram 700 illustrates example procedures used by various embodiments. Flow diagram 700 includes process and operations that, in various embodiments, are carried out by one or more of the devices illustrated in FIGS. 1-6 or via a computer system or components thereof.

Although specific procedures are disclosed in flow diagram 700, such procedures are examples. That is, embodiments are well suited to performing various other operations or variations of the operations recited in the processes of flow diagram 700. Likewise, in some embodiments, the operations in flow diagram 700 may be performed in an order different than presented, not all of the operations described in one or more of these flow diagrams may be performed, and/or one or more additional operation may be added.

The following discussion sets forth in detail the operation of some example methods of operation of embodiments. With reference to FIG. 7, flow diagram 700 illustrates example procedures used by various embodiments. Flow diagram 700 includes some procedures that, in various embodiments, are carried out by a processor under the control of computer-readable and computer-executable instructions. In this fashion, procedures described herein and in conjunction with flow diagram 700 are or may be implemented using a computer, in various embodiments. The computer-readable and computer-executable instructions can reside in any tangible computer readable storage media, such as, for example, in data storage features such as RAM (e.g., SRAM, DRAM, Flash, embedded DRAM, EPROM, EEPROM, etc.) and/or ROM. The computer-readable and computer-executable instructions, which reside on tangible computer readable storage media, are used to control or operate in conjunction with, for example, one or some combination of processors. It is further appreciated that one or more procedures described in flow diagram 900 may be implemented in hardware, or a combination of hardware and firmware, or a combination of hardware and software running thereon.

FIG. 7A is a flow diagram 700 of an example method of implementing a programmable built-in self test engine for testing memory on a chip, in accordance with an embodiment. Reference will be made to elements of FIGS. 1-6 to facilitate the explanation of the operations of the method of flow diagram 700.

At 708, in one embodiment, the PBIST is programmed with a desired test program. In one embodiment, step 708 is optional and used if IC 100 has a programmable built in self-test module (PBIST), e.g., PBIST 220. PBIST may be programmed by serial interface.

At 710, transactions are generated for MBISR 101 by being read from data in counters, such as those in FIG. 5. In one embodiment, a port bus slave 207 sends transactions. In one embodiment, transactions include patterns/algorithms for testing and/or repairing a memory block. In one embodiment, a user may program the pattern/algorithm that is run.

At 720, in one embodiment, faults are searched for. For example, when a built-in self-test performs a test using a pattern/algorithm the test may find defective memory cells in memory core 104. In some embodiments, a user may select a pattern from a set of patterns. In another embodiment, a user may program the pattern.

At 722, faults are communicated to a repair module for effectuating a fix to either a memory cell location, or by replacing unreliable bits in the data stream.

FIG. 7B is a flow diagram 750 of a method of implementing a programmable built-in self repair (BISR) engine for testing memory on a chip, in accordance with various embodiments.

At 754, a programmable built-in self-repair (PBISR) module is programmed with repair instructions. These repair instructions can include discrete instruction steps, as well as decision criteria and threshold values for evaluating quantity, timing, frequency, location, clustering, and type of memory cell failures, e.g., failed memory cells (short, open, etc.), or memory cells that exhibit weaknesses such as sensitivity to variable retention time (VRT), random telegraph noise (RTN), weak performance, bits that intermittently flip, PVT sensitive memory cells, etc. As processes continue to shrink, memory cell sensitivity might increase in frequency and percentage. Due to leakage or weaknesses in the gate, and other unexplained causes, the retention of a charge in a given memory cell is not always consistent, sometimes meeting the planned refresh period, and other times, not. Thus, incorporating built-in mechanisms such as PBIST and/or PBISR, will enhance the performance of the chip, improve production yield, reduce mean time between failures (MTBF), reduce customer down time and service interrupts, and provide other cost and resource savings. Similar to PBIST, PBISR can be programmed by a wide variety of methods, including by production test equipment, or by a user in the field performing an update on the repair mechanism, based on actual performance in the field, or other statistical models and updates.

At 756, identified faults are received from the test, whether sources from automatic test equipment at production, non-programmable BIST or programmable BIST. The faults received can be stored either permanently in eFUSE, such as during production, or stored temporarily in cache, such as during in-field operation. The PBISR can make repairs permanent by moving the fault data from cache to programming the eFUSE via a built in charge pump coupled to the eFUSE block. User input to the PBISR can make this a user-selectable model, or a default model can automatically perform the programming in a power-down instruction.

The present disclosure is well-suited for testing and repairing an IC having any type of memory cell construction, including DRAM, SRAM, embedded DRAM, Flash EPROM, EEPROM, etc.) and/or ROM, and combinations thereof, which many ICs have as a SOC. Furthermore, the present disclosure is well-suited to a wide arrangement of memory chip configurations, such as a single monolithic chip, multi-chip modules, stacked ICs using through silicon vias and other configurations that could allow a PBIST and/or PBISR to service one or more of the ICs in the assembly, and sharing resources therein.

At 758, in one embodiment, discovered faults are fixed. For example, if a BIST is performed on memory bits 104 in memory bank 103, if a fault (e.g., defective bit) is found, local redundancy module 105 will provide unused memory to replace the defective memory. In an embodiment, when local redundancy module 105 has less than a predetermined percentage of unused memory left, global bit redundancy module 106 will allow memory bank 103 to use empty memory cells comprised within global redundancy module 106.

Example embodiments of the subject matter are thus described. Although various embodiments of the subject matter have been described in a language specific to structural features and/or methodological acts, it is to be understood that the appended claims are not necessarily limited to the specific features or acts described above. Rather, the specific features and acts described above are disclosed as example forms of implementing the claims and their equivalents.

The invention claimed is:

1. An integrated circuit chip comprising:
at least one memory built-in self-repair (MBISR) module comprising:
an interface that receives signals external to said integrated circuit chip; and
at least a first cache coupled to the interface, wherein said first cache implements logic to denote defective elements;
configuration registers coupled to said MBISR module and configured to store configuration values; and
a built-in self-test (BIST) module communicatively coupled to said MBISR module, wherein said BIST module is configured to control loop manipulation op-code, access generation op-code, and said configuration values.

2. The integrated circuit chip of claim 1, wherein said MBISR module further comprises:
a port bus slave for programming MBISR registers.

3. The integrated circuit chip of claim 1, wherein said BIST module further comprises:
a programmable checker to compare data.

4. The integrated circuit chip of claim 1, wherein said BIST module is configured to control counters programmed in response to said configuration values.

5. The integrated circuit chip of claim 1, wherein said BIST module comprises plurality of counters, each configured by a corresponding one of the configuration values.

6. The integrated circuit chip of claim 5, wherein said plurality of counters comprises at least one row-fast counter.

7. The integrated circuit chip of claim 5, wherein said BIST module is configured to access different address sources from one or more counters of said plurality of counters.

8. The integrated circuit chip of claim 1, wherein said first cache is configured to receive a port bus transaction to clear said first cache.

9. The integrated circuit chip of claim 1, further comprising:
a second MBISR module coupled to said at least one MBISR module and configured to run in parallel with said at least one MBISR module.

10. The integrated circuit chip of claim 1, further comprising:
at least one second cache coupled to said interface; and wherein:
said first cache is configured to store information for said defective elements in a manner that facilitates a repair in the chip; and
said second cache is configured to store information for said defective elements in a manner that enables a failure analysis of each of said defective elements.

11. The integrated circuit chip of claim 1, further comprising:
one second cache for each partition of core memory; and wherein:
said second cache is coupled to said interface;
said first cache is configured to store information for said defective elements in a manner that facilitates a repair in the chip; and said second cache is configured to store information for said defective elements in said each memory block in a manner that enables a failure analysis of each of said defective elements.

12. The integrated circuit chip of claim 3, wherein said BIST further comprises:
a transactor configured to generate memory transactions.

13. The integrated circuit chip of claim 1, wherein said BIST module is configured to perform tests according to said configuration values.

14. The integrated circuit chip of claim 1, wherein said MBISR module is configured to operate said first BIST on a data storage outside of core memory.

15. The integrated circuit chip of claim 14, wherein said data storage outside of said core memory is selected from a group comprising cache, uCTRL memory, and tracebuffer memory.

16. The integrated circuit chip of claim 1, wherein said MBISR module is configured to implement in-field repair.

17. The integrated circuit chip of claim 1, wherein said BIST module comprises at least one write port and at least one read port, both write port and read port being coupled to memory of the chip.

18. An integrated circuit chip comprising:
at least two memory built-in self-repair (MBISR) modules, wherein said MBISR modules are configured to run in parallel and each of said MBISR modules comprises:
an interface that receives signals external to said integrated circuit chip; and
a first cache coupled to the interface, wherein:
said first cache implements logic to denote defective elements.

19. The integrated circuit chip of claim 18, wherein each of said MBISR modules further comprises:
a port bus slave for programming MBISR registers.

20. The integrated circuit chip of claim 18, wherein each of said MBISR modules further comprises a built-in self-test (BIST) module communicatively coupled to each of said MBISR modules.

21. The integrated circuit chip of claim 20, wherein said BIST module in each of said MBISR modules further comprises a programmable checker to compare data.

22. The integrated circuit chip of claim 21, wherein said programmable checker comprises at least one read compare port coupled to respective said MBISR modules.

23. The integrated circuit chip of claim 20, wherein said BIST module in each of said MBISR modules is configured to control loop manipulation op-code and access generation op-code.

24. The integrated circuit chip of claim 20, wherein said BIST modules are configured to run synchronously or asynchronously.

25. The integrated circuit chip of claim 24, wherein said BIST modules are configured independently to run independent tests in asynchronous mode.

26. The integrated circuit chip of claim 18, further comprising:
at least one second cache coupled to said interfaces of both of said MBISR modules; and
wherein said first cache in each of said MBISR modules is used to store information for said defective elements denoted by each of said MBISR modules in a manner that facilitates a repair in the chip; and
wherein said second cache is used to store information for said defective elements denoted by both of said MBISR modules in a manner that enables a failure analysis of each of said defective elements.

27. The integrated circuit chip of claim 18, wherein:
each of said MBISR modules further comprises at least one second cache coupled to said interface of each of respective said MBISR modules;
said first cache is used to store information for said defective elements in a manner that facilitates a repair in the chip; and
said second cache is used to store information for said defective elements in a manner that enables a failure analysis of each of said defective elements.

28. The integrated circuit chip of claim 18, wherein said MBISR modules are configured to implement in-field repair.

29. The integrated circuit chip of claim 18, wherein said MBISR modules are configured to bypass surrounding logic and read memory functionality directly.

30. The integrated circuit chip of claim 1, wherein the BIST module and MBISR module are concurrently operating with core memory.

31. The integrated circuit chip of claim 1 wherein said MBISR module is configured to bypass surrounding logic and read memory functionality directly.

32. The integrated circuit chip of claim 1 wherein said programmable checker comprises at least one read compare port coupled to said MBISR module.

* * * * *